Jan. 3, 1967 J. A. MACALUSO 3,296,461

HIGH-SPEED BINARY SWITCH

Filed June 23, 1964

JOHN A. MACALUSO

INVENTOR.

BY

V. C. MULLER

ATTORNEY.

United States Patent Office 3,296,461

Patented Jan. 3, 1967

3,296,461
HIGH-SPEED BINARY SWITCH

John A. Macaluso, Fairbrook, Pa., assignor, by mesne assignments, to the United States of America as represented by the Secretary of the Navy Filed June 23, 1964, Ser. No. 377,431
3 Claims. (Cl. 307—88.5)

This invention relates to bistable switching devices and in particular to high-speed bistable switching devices which utlize two termnal negative resistance semiconductors commonly known in the art as tunnel diodes and backward diodes.

The rapid evolution of computers, data processing machinery, and the like has brought about a requirement for faster and faster switching devices. The prime value and utility of electronic computers is the amazingly high speeds at which they operate. These high speeds are possible only through the use of electronic switches. Obviously, then, one way to improve these machines is to improve the switch. When a switch is used to turn a current "off" and "on" the speed of the switch is limited by the rise and fall time. Further limitations are imposed by the active elements of the switch. When tubes were used, the switching time was quite slow. The discovery of transistors and their subsequent utilization as solid state switches made greatly increased switching speeds possible. Here, too, were limitations because of inherent characteristics such as junction capacitance, charge density, etc.

The invention herein described is a switch that utilizes two terminal semiconductor devices having a negative resistance characteristic. These devices are commonly known as tunnel diodes. Theoretically, tunnel diodes are capable of operating at several hundred times the speed of transistors. In addition to the high rate of switching speed possible, the power consumption of a tunnel diode switch is considerably less than that of a transistor switch.

Therefore, it is an object of this invention to porvide an improved bistable switch.

It is a further object of this invention to provide an improved bistable switch having a memory capability.

It is still a further object of this invention to provide a high-speed bistable switch having a constant current output.

It is yet another object of this invention to provide a high-speed bistable switch which diverts the output current from one point to another without interruption.

These and other objects and novel features of this invention will become apparent when reading the following specification taken in conjunction with the accompany drawings in which.

Figure 2:
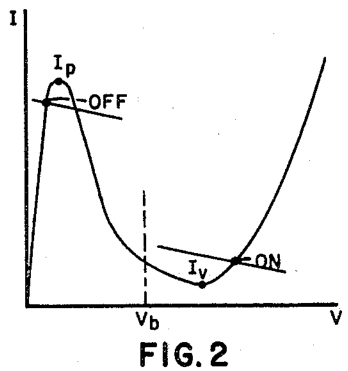
FIGURE 2 is a graph showing a typical tunnel diode characteristic volt-ampere curve.

The tunnel diode 26 is a two-terminal semiconductor device which has a characteristic volt-ampere curve as shown in the graph in FIGURE 2. The diodes 22 and 24 are also two-terminal semiconductor devices, commonly known as backward or back diodes, which have the characteristics of the curve shown in FIGURE 3.

Figure 1:
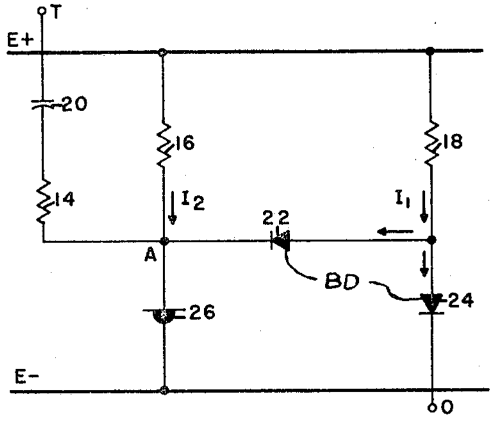
FIGURE 1 is a schematic diagram of the invention.

The circuit components shown in FIGURE 1 are connected as follows: Connected to line E+, which is a positive source of current, is one end of resistive element 18. Connected to the other end of resistive element 18 is the anode side of backward diode 24. The cathode side of backward diode 24 is the output terminal labeled O. At the junction of backward diode 24 and resistive element 18 there is also connected the anode side of backward diode 22. At the cathode side of backward diode 22 there is connected the anode side of tunnel diode 26, one side of resistor 14 and one side of resistor 16. The other side of resistor 16 is in turn connected to point E+. The other side of resistor 14 is connected, through capacitor 20 to terminal T, the input trigger pulses. The cathode side of tunnel diode 26 is connected to E−.

In operation, there are two curernts [$I_1$ and $I_2$] flowing in the circuit. $I_1$ is the primary switchable current and its path is from E(+), through resistor 18, backward diode 22, and tunnel diode 26 to E(−). $I_2$, the bias current also flows from E+ through resistor 16 and tunnel diode 26 to E−. $I_1$, established by the value of resistor 18, is dependent upon the operating characteristics of the active elements and $I_2$, as determined by resistor 16 is a bias current. The sum of $I_1+I_2$ must be greater than the valley current, point $I_v$ on FIGURE 2, and less than the peak curent, point $I_p$ on FIGURE 2. When currents $I_1$ and $I_2$ are flowing as stated, the tunnel diode is in the "off" or low voltage condition and the operating point is labeled "off" on the curve of FIGURE 2. Concurrently, the potential across backward diode 22 is sufficiently high to pass $I_1$. The point marked "H" on FIGURE 3 indicates the operating point of backward diode 22 when tunnel diode 26 is in the "off" condition. Backward diode 24 is operating at point L on the graph of FIGURE 3 and as such, presents a high impedance to curernt $I_1$. Therefore, no output appears at the output terminal O.

The bias voltage, $V_b$ shown in FIGURE 2, should be approximately equal to the average of the tunnel diode operating voltages, that is $$=\frac{V_{off}+V_{on}}{2}$$

The exact value is allowed some latitude and is further established by the choice of tunnel diode type. Consequently, the diodes 22 and 24 should be chosen such that the potential difference between point L and point H is approximately equal to one-half the difference of the tunnel diode operating voltages $$=\tfrac{1}{2}\left(\frac{V_{on}-V_{off}}{2}\right)$$

Figure 3:
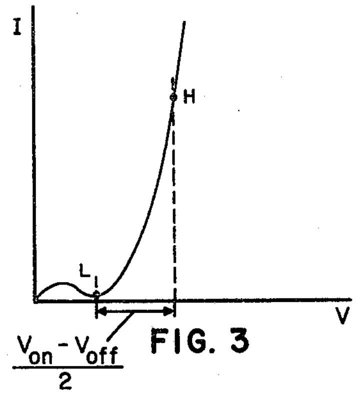
FIGURE 3 is a graph showing a typical backward diode characteristic volt-ampere curve.

Upon the application of a positive-going pulse of given amplitude to the trigger input terminal T, the tunnel diode 26 is switched to the "on" condition [operating point labeled "on" on graph of FIGURE 3]. The switching results because the tunnel diode 26 sees the pulse as an increase in potential at node A. At the same time, the potential difference across backward diode 22 is reduced and its impedance increases. In other words, the operating point of backward diode 22 changes from point H to point L on the graph of FIGURE 3. Backward diode 24 now presents less impedance to the flow of $I_2$ than does backward diode 22 and as a result, $I_2$ now flows through backward diode 24. In effect, backward diodes 22 and 24 have exchanged operating points thus allowing current $I_2$ to appear at output terminal.

Thus, it is apparent that the transfer of current from ground to the output terminal is a smooth transition which does not necessitate the starting and stopping of current. Since the current does not have to overcome the "inertia," small as it is, the ultimate efficiency and speed of the switch is enhanced.

At this point it is appropriate to note that once the tunnel diode is switched to the "on" condition it will remain there. Consequently, the circuit has an inherent memory capability. In order to cause the tunnel diode to switch back to the "off" condition, a negative going pulse must be applied to the trigger input or the bias current must be removed.

The action of the circuit elements is simply reversed when the reset or negative-going trigger is applied to node A. The negative-going pulse causes a decrease in potential at node A which in turn causes tunnel diode 26 to switch back to the "off." At the same time the potential across backward diode 22 is increased, the impedance therefore decreased and the primary current is now urged to flow through backward diode 22. The operating point of backward diode is shifted back to point H on FIGURE 3 and backward diode 24 again presents high impedance, having point L on FIGURE 3 as its operating point. Although the description of FIGURE 1 makes reference to backward diodes 22 and 24, the circuit will operate equally as well with conventional diodes having a high speed switching capability.

The tunnel diode 26 shown in FIGURE 1 has a characteristic curve as shown in FIGURE 2. Voltage is plotted on the abscissa and current is plotted on the ordinate. $I_p$ indicates the point on the curve known as the peak current and $I_v$ indicates the point on the curve known as the valley current. The two oblique solid lines, one each passing through points labeled "off" and "on," are load lines representative of the two operating conditions of the tunnel diode. Unlike an ordinary tunnel diode switching circuit in which one load line intersects the characteristic curve in each region of positive resistance, the novel circuit herein described has two load lines as shown. This situation arises from the fact that the back diodes 22 and 24 divert part of the current flowing through the tunnel diode, thereby creating two distinct biasing conditions. The point on the curve where the load line intersects the first region of positive resistance is labeled "off" and indicates one of the two stable operating points. As can be seen from the graph this point exhibits the characteristics of high conduction and low voltage. As the load line is momentarily shifted beyond the peak current value $I_p$ by an increase in voltage and/or current, the operating point rapidly switches through the region of negative resistance to the point where the load line intersects the second region of positive resistance. This point is labeled "on" in FIGURE 2. Conversely when the tunnel diode is in the "on" condition, a momentary decrease in voltage and/or current to a value less than $I_v$ will cause the operating point to switch back to the "off" condition. In both cases, the transition from one state to the other is extremely rapid.

FIGURE 3 is a characteristic curve of a backward diode which is merely a tunnel diode which has been etched to the extent that the peak current is quite low. Although back diodes are utilized in the present embodiment, a conventional diode having a high switching speed could be used as well. The curve as shown has two points labeled H and L. These points indicate the two operating points of diodes 24 and 26. The point labeled L is analogous to $I_v$ on FIGURE 2. Point H shows the high conducting condition of the back diodes.

Figure 4:
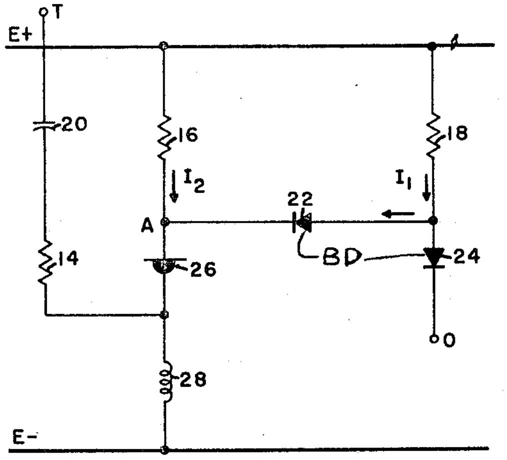
FIGURE 4 is a schematic diagram of the invention utilizing an alternative trigger circuit.

Referring now to FIGURE 4, it will be seen that the trigger input has been changed to the cathode side of the tunnel diode and a choke 28 has been added between the trigger input and E−. Obviously, the function of the choke is to assure that the transient trigger pulse will not be shorted to ground while at the same time the bias current flows unaffected. The purpose of FIGURE 4 is to show that the basic invention is that of the interaction between the tunnel diode and an associated pair of backward diodes, that action being one in which the tunnel diode generates potential changes across the backward diodes causing them to exchange operating points. Actually, the trigger input is not limited to one of the two configurations shown and should in no way limit the scope of the invention.

Figure 5:
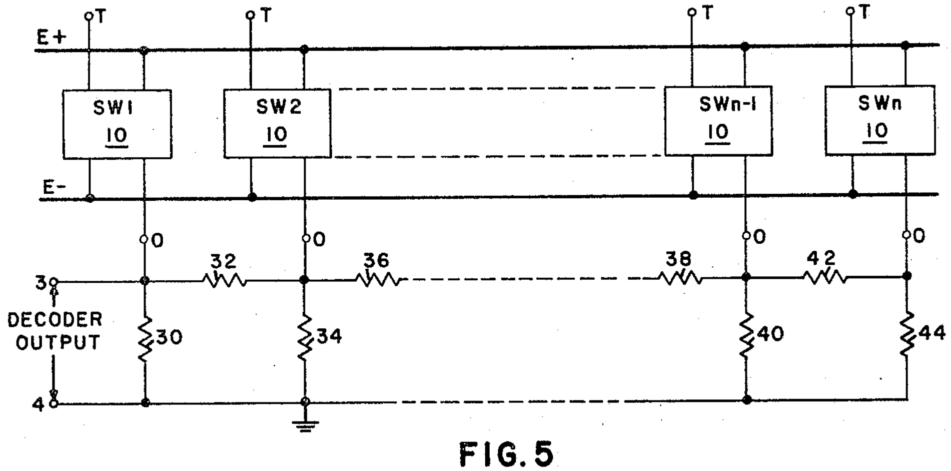
FIGURE 5 is a schematic diagram depicting the invention being utilized as a high speed decoder or digital to analog converter.

FIGURE 5 shows plurality of switches 10, such as those described above, connected to an ordinary resistor ladder network in such a manner that the combination produces a compact, high-speed digital-to-analog converter [decoder]. The switches 10 are further identified as $Sw_1$, $Sw_2$, $Sw_{n-1}$, and $Sw_n$, the exact number of which depends upon the particular application in which the decoder is to be used. The resistive ladder is designed so that the position of a switch with respect to the output terminals will determine the binary "weight" of its particular contribution to the decoder output. The switch nearest terminals 3 and 4, in this case, switch $Sw_1$, representative of the most significant bit of the binary number being decoded, and the switch furthest from the output terminals 3 and 4 is representative of the least significant bit.

The construction as shown in FIGURE 5 has switches 10 connected to supply buses E+ and E− as shown in FIGURES 1 and 4. The source of trigger pulses from a serial register or the like is connected to each switch through terminal T, shown above supply bus E+. The output terminal of switch $Sw_1$ is connected to decoder output terminal 3, one side of resistor 30 and one side of resistor 32. The other side of resistor 30 is in turn connected to ground. The output terminal O of switch $Sw_2$ is connected to the other side of resistor 32, one side of resistor 34 and one side of resistor 36. The other side of resistor 34 is connected to ground. The dashed lines between switch $Sw_2$ and switch $Sw_{n-1}$ and between resistor 36 and 38 indicate that the number of intervening switches is variable and that the resistor ladder network associated therewith is constructed as that shown with switch $Sw_2$ and $Sw_{n-1}$.

The output of switch $Sw_{n-1}$ is connected to one side each of resistors 38, 40, and 42. The other side of resistor 40 is connected to ground and the other side of resistor 42 is connected to the output terminal O of switch $Sw_n$ and to one side of resistor 44 whose other side is connected to ground.

By way of example of the operation of the above described decoder, consider a plurality of switches connected to a resistor ladder network so designed that each switch output produces a voltage at the decoder output terminals equal to one-half the value of the preceding switch. In order to convert a binary number, say 11010011 to its analog, the first switch would receive a pulse, the second switch would receive a pulse, the third no pulse, the fourth a pulse, the fith and sixth each no pulse and the seventh and eighth each a pulse. The resulting voltage at the output terminals 3 and 4 would be $$V+\frac{v}{2}+0+\frac{v}{8}+0+\frac{v}{64}+\frac{v}{128} \text{ or } 1\frac{83}{124}V$$

which is a voltage analog of the binary number 11010011.

All subsequent binary numbers would be decoded similarly and it should be noted that when a bit changes value from 1 to 0 it would be necessary to reset the respective switch with a negative pulse. The output of a series of binary numbers would consist of a variable positive D.C. which can then be recorded as a graph or the like. A decoder such as described above utilizing the invention herein disclosed has been constructed and was found capable of processing more than 100 megabits/second.

In view of the foregoing description it will be seen by those skilled in the art that this invention has many potential uses, for example, as a logical operator, a binary decoder, a flip-flop, a bistable gate, etc. Furthermore, the use of tunnel diodes and backward diodes makes this device extremely fast and yet, due to the simplicity of the component elements, the dependability and longevity are virtually infinite. The theoretical limits of switching speed is less than 1 nanosecond. Conventional switches utilizing transistors and the like cannot begin to approach speeds such as this due to the magnitude of their junction capacitance, charge density, and other parameters.

Although this device has been described with a certain degree of particularity it is understood that many modification are possible without departing from the spirit and scope of the invention as hereinafter claimed.

What is claimed is:

1. A switchable current source having two stable states of operation for use in a digital to analog converter comprising:

constant current means comprising a voltage source and first and second resistors each having an end connected to said voltage source;

a tunnel diode having first and second operating conditions and having a first terminal connected to the other end of said first resistor;

a source of reference potential;

a first circuit means connecting a second terminal of said tunnel diode with said source of reference potential;

an analog output terminal;

a pair of alternately conducting backward diodes opposingly connected together at a junction and having one end thereof connected to said first terminal of said tunnel diode and the other end thereof connected to said analog output terminal, one of said pair being arranged for conducting an analog current to said tunnel diode and the other of said pair being arranged for conducting said analog current to said analog output terminal;

second circuit means connecting said junction of said backward diodes to the other end of said second resistor;

a digital input terminal; and third circuit means connecting said digital input terminal with one of said terminals of said tunnel diode for conducting a digital input potential for inducing a change of state of said tunnel diode from one operating condition to the other operating condition; said second resistor having a resistance to pass said analog current of a predetermined size and said first resistor having a resistance to pass a bias current, the sum of said analog and bias currents being less than the peak current of said tunnel diode.

2. A current switch according to claim 1 wherein:

said first circuit means comprises a conductor; and said third circuit means is connected to said first terminal of said tunnel diode whereby a digital input potential of the same polarity as said voltage source will increase the potential across said tunnel diode and a digital input potential of opposite polarity will decrease the potential across said tunnel diode.

3. A current switch according to claim 1 wherein:

said first circuit means comprises a choke; and said third circuit means is connected to said second terminal of said tunnel diode whereby a digital input potential of the same polarity as said voltage source will decrease the potential across said tunnel diode and a digital input potential of opposite polarity will increase the potential across said tunnel diode.

References Cited by the Examiner

UNITED STATES PATENTS

| | | | |
|---|---|---|---|
| 2,959,689 | 11/1960 | Gilbert | 307—88.5 |
| 2,986,652 | 5/1961 | Eachus | 307—88.5 |
| 3,155,846 | 11/1964 | Parham | 307—88.5 |
| 3,166,682 | 1/1965 | Parham | 307—88.5 |
| 3,207,924 | 9/1965 | Kaufman | 307—88.5 |

References Cited by the Applicant

UNITED STATES PATENTS

| | | |
|---|---|---|
| 3,061,743 | 10/1962 | Fukui et al. |
| 3,070,788 | 12/1962 | Tompkins. |
| 3,078,376 | 2/1963 | Lewin. |
| 3,092,824 | 6/1963 | Bentley. |
| 3,103,597 | 9/1963 | Novick et al. |

ARTHUR GAUSS, *Primary Examiner.*
R. H. EPSTEIN, *Assistant Examiner.*